US006959428B2

(12) United States Patent
Broberg, III et al.

(10) Patent No.: US 6,959,428 B2
(45) Date of Patent: Oct. 25, 2005

(54) DESIGNING AND TESTING THE INTERCONNECTION OF ADDRESSABLE DEVICES OF INTEGRATED CIRCUITS

(75) Inventors: Robert Neal Carlton Broberg, III, Rochester, MN (US); Troy Evan Faber, Rochester, MN (US); Gary Scott Delp, Rochester, MN (US); Paul Gary Reuland, Rochester, MN (US); Daniel James Murray, Rochester, MN (US)

(73) Assignee: LSI Logic Corporation, Milpitas, CA (US)

(*) Notice: Subject to any disclaimer, the term of this patent is extended or adjusted under 35 U.S.C. 154(b) by 118 days.

(21) Appl. No.: 10/465,186

(22) Filed: Jun. 19, 2003

(65) Prior Publication Data

US 2004/0261050 A1    Dec. 23, 2004

(51) Int. Cl.$^7$ ............................................. G06F 17/50
(52) U.S. Cl. ................................ 716/18; 716/1; 716/3
(58) Field of Search ............................... 716/1, 3, 9–18; 714/6; 711/167; 710/305; 717/158

(56) References Cited

U.S. PATENT DOCUMENTS

| | | | |
|---|---|---|---|
| 4,656,592 A | 4/1987 | Spaanenburg et al. | 364/490 |
| 5,818,728 A | 10/1998 | Yoeli et al. | 364/491 |
| 5,818,729 A | 10/1998 | Wang et al. | 364/491 |
| 6,459,136 B1 | 10/2002 | Amarilio et al. | 257/529 |
| 6,668,337 B2 * | 12/2003 | Takahashi et al. | 714/6 |
| 6,823,502 B2 * | 11/2004 | Wingren et al. | 716/9 |
| 2003/0101307 A1 * | 5/2003 | Gemelli et al. | 710/305 |
| 2003/0140337 A1 * | 7/2003 | Aubury | 717/158 |
| 2003/0225988 A1 * | 12/2003 | Ralphs | 711/167 |
| 2004/0049672 A1 * | 3/2004 | Nollet et al. | 713/100 |

FOREIGN PATENT DOCUMENTS

| | | | | |
|---|---|---|---|---|
| JP | 01202397 | 1/2001 | | G06F 17/50 |
| JP | 02202886 | 1/2002 | | G06F 9/44 |

* cited by examiner

*Primary Examiner*—Vuthe Siek
(74) *Attorney, Agent, or Firm*—Ojanen Law Offices

(57) ABSTRACT

A register address generation tool is used during the design of semiconductor products. For those registers and/or memories that are addressable on a bus, the register address generation tool creates the interconnect RTL, header files, static timing analysis constraint files, and verification testcases. The tool also maintains coherence between what has been generated and the available resources for the design of the semiconductor product in a design. If there are any registers and/or memories that are not being used, the register address generation tool may further generate the RTL that will convert these unused resources to performance-enhancing features such as control registers, status registers, etc. The register address generation tool read a design database having an application set to determine what hardmacs and what transistor fabric is available. It also receives as input a bus specification and address parameters. The register address generation tool may be used with a suite of generation tools to achieve the rapid design and realization of a new semiconductor product.

20 Claims, 6 Drawing Sheets

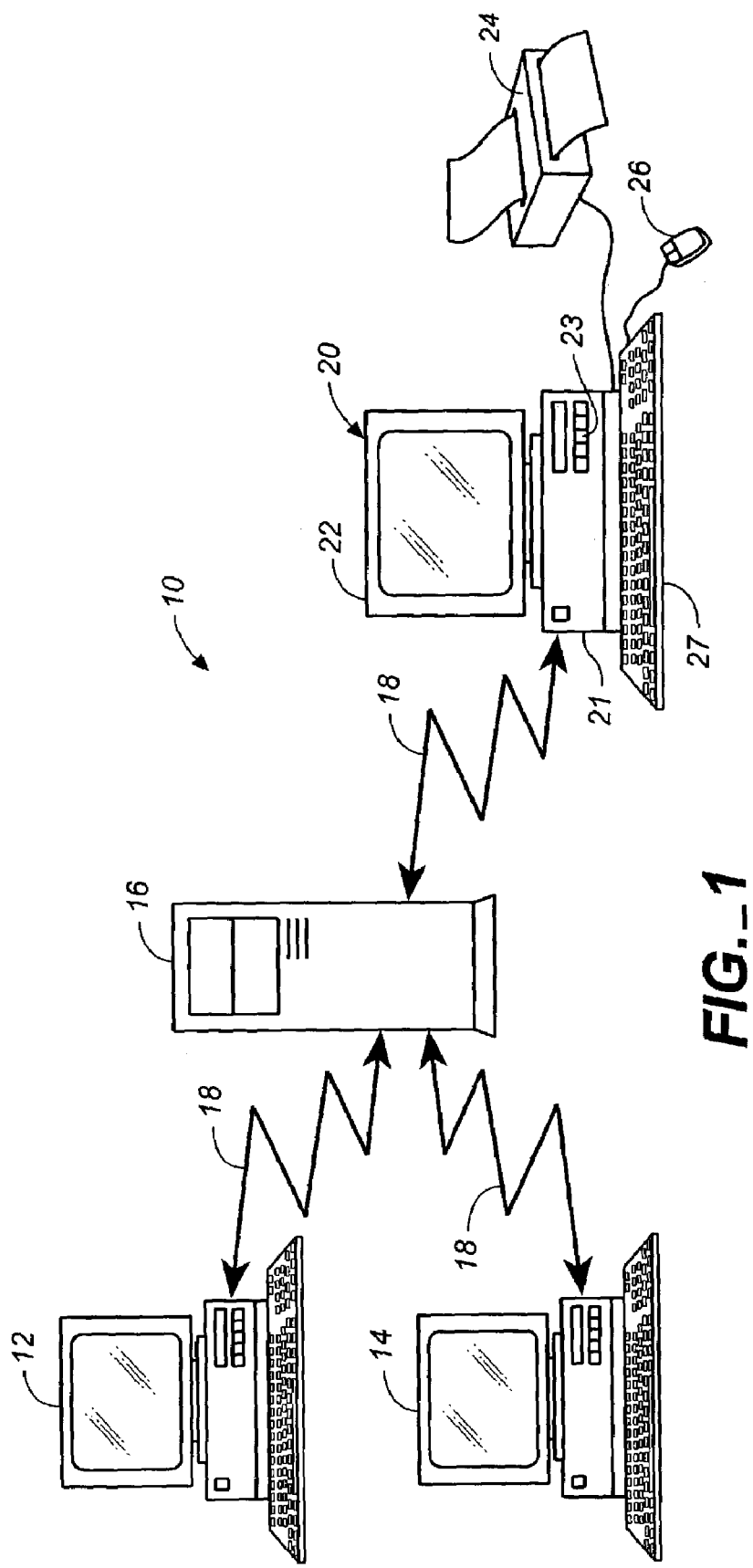
FIG._1

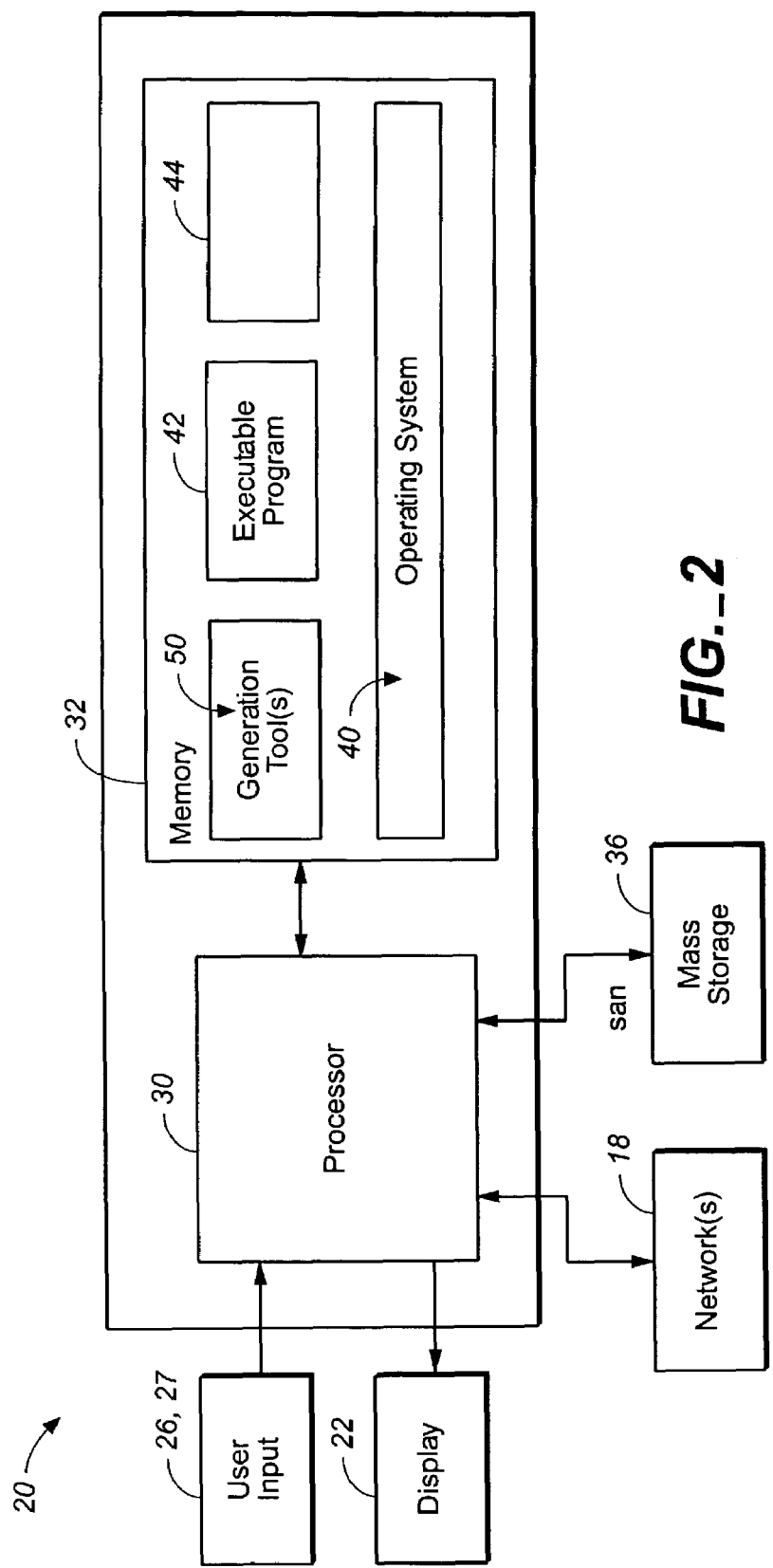
FIG._2

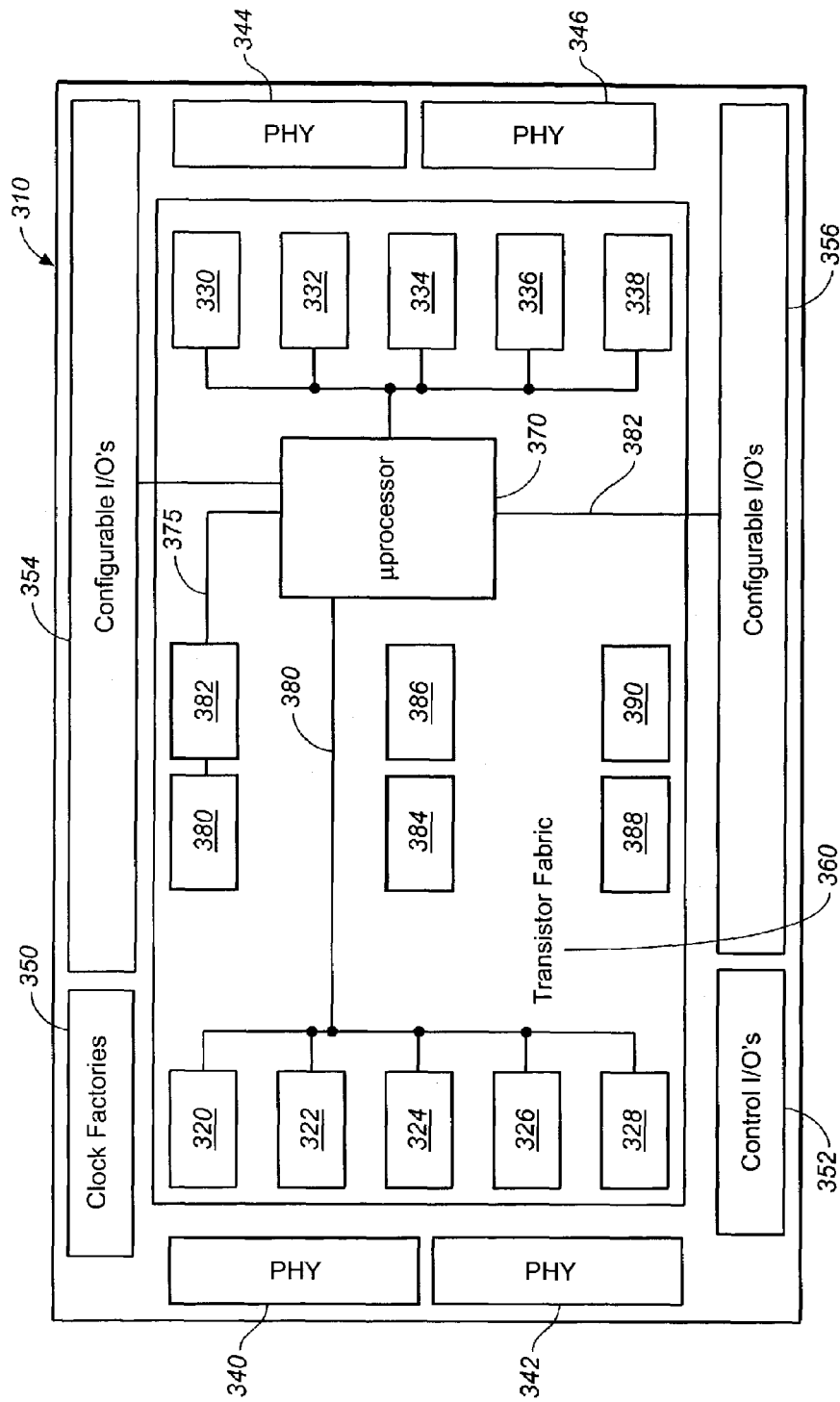
FIG._3

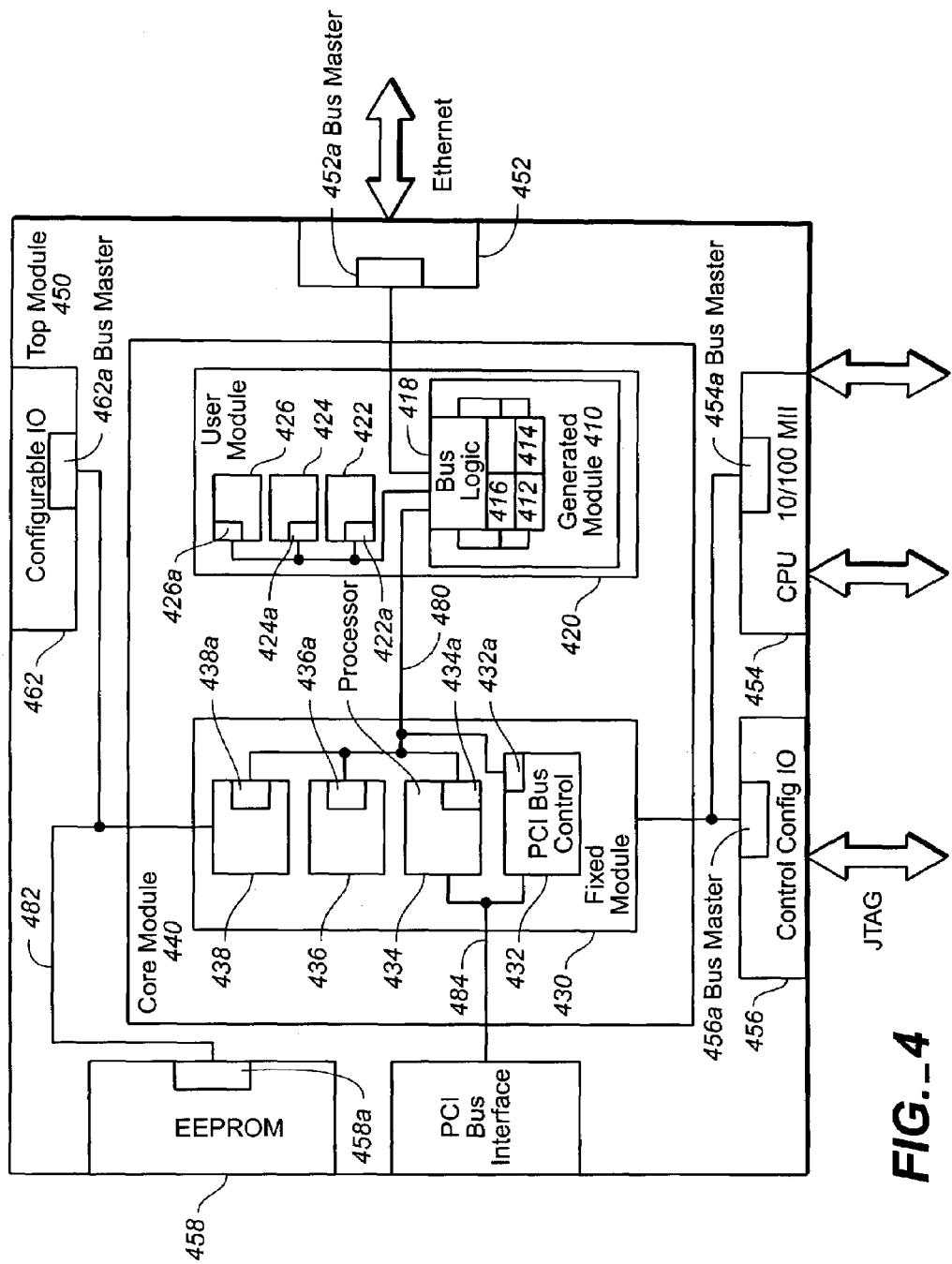
FIG._4

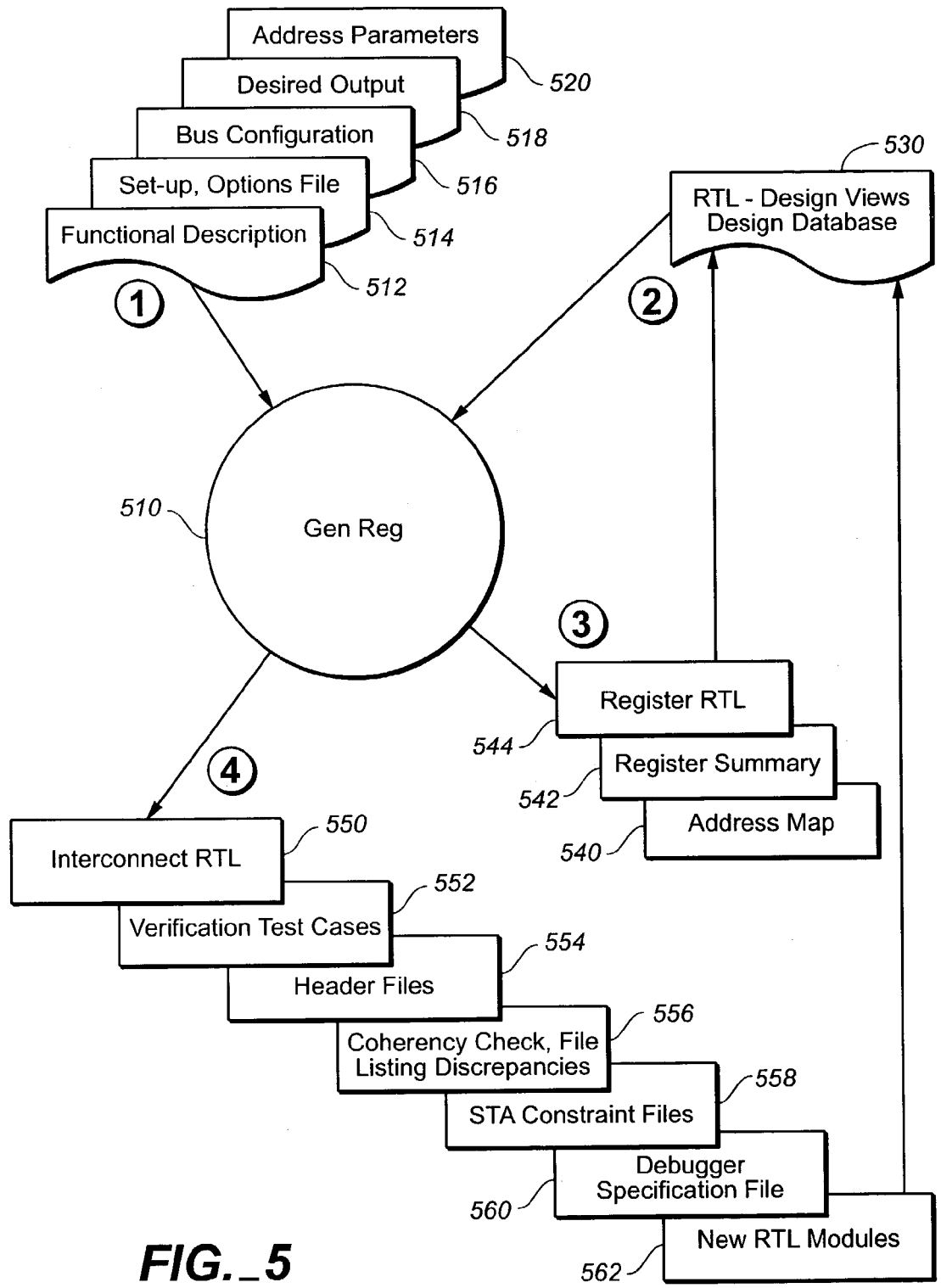
FIG._5

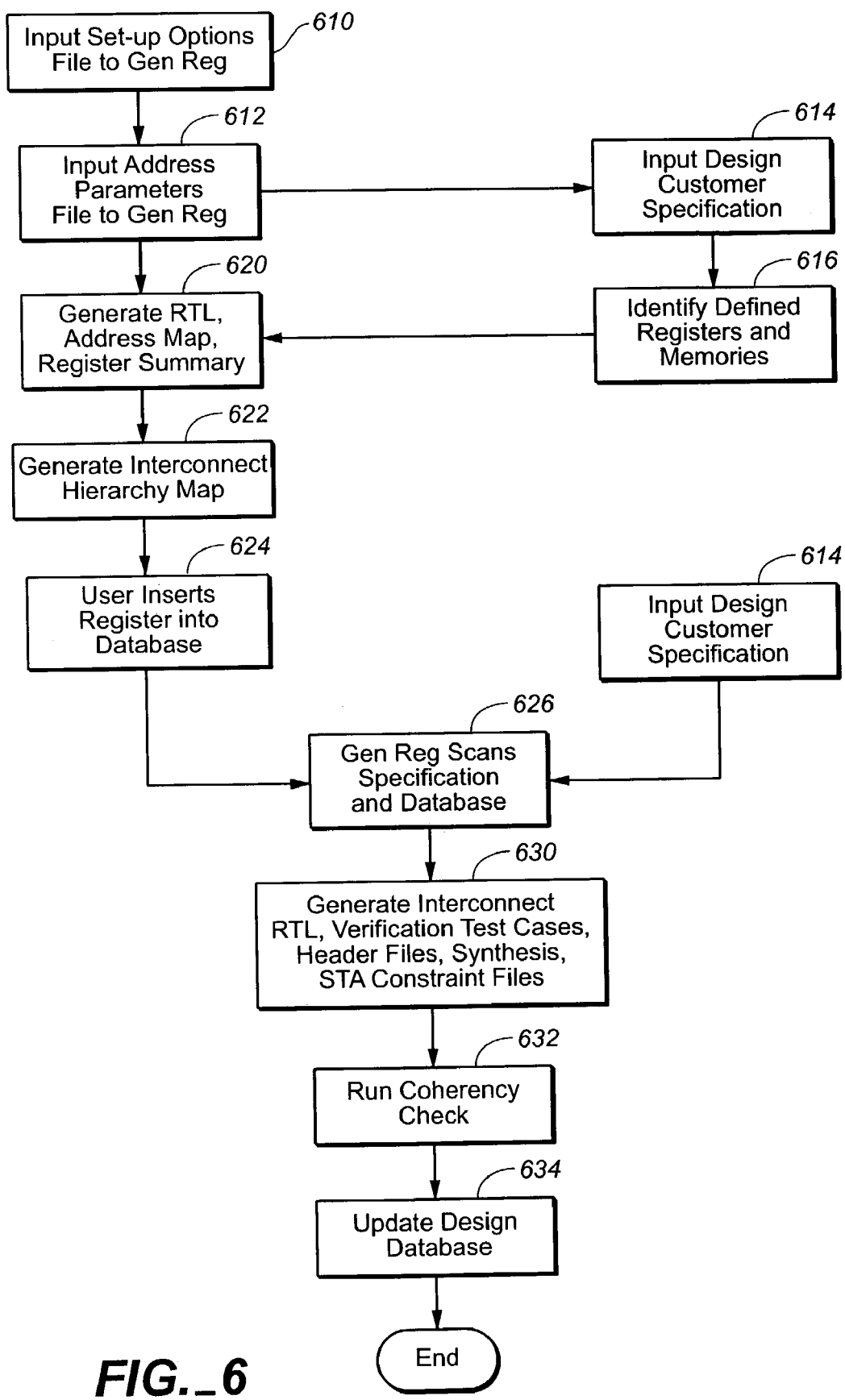
FIG._6

DESIGNING AND TESTING THE INTERCONNECTION OF ADDRESSABLE DEVICES OF INTEGRATED CIRCUITS

CROSS REFERENCE TO RELATED APPLICATIONS

The present application is related to the following United States patent applications, which are hereby incorporated by reference in their entireties: copending U.S. patent application Ser. No. 10/435,168 filed 08 May 2003 entitled Automation of the Development, Testing, and Release of a Flow Framework and Methodology to Design Integrated Circuits; U.S. patent application Ser. No. 10/318,792 filed 13 Dec. 2002 entitled Flexible Template Having Embedded Gate Array and Composable Memory for Integrated Circuits; copending U.S. patent application Ser. No. 10/318,623 filed 13 Dec. 2002 entitled Automated Selection and Placement of Memory During Design of an Integrated Circuit; U.S. Pat. No. 6,823,502 B2 entitled Placement of Configurable Input/Output Buffer Structures During Design of Integrated Circuits; and copending U.S. patent application Ser. No. 10/335,360 filed 31 Dec. 2002 entitled A Simplified Process to Design Integrated Circuits.

FIELD OF THE INVENTION

This invention relates generally to the field of electronic circuit design and more particularly relates to developing a design template for implementation and interchange of addressable registers during design and development of the integrated circuits.

BACKGROUND

Integrated circuits comprise many transistors and the electrical interconnections between them. Depending upon the interconnection topology, transistors perform Boolean logic functions like AND, OR, NOT, NOR and are referred to as gates. Some fundamental anatomy of an integrated circuit will be helpful for a full understanding of the factors affecting the flexibility and difficulty to design an integrated circuit. An integrated circuit comprises layers of a semiconductor, usually silicon, with specific areas and specific layers having different concentrations of electron and hole carriers and/or insulators. The electrical conductivity of the layers and of the distinct areas within the layers is determined by the concentration of dopants that are ions implanted into these areas. In turn, these distinct areas interact with one another to form the transistors, diodes, and other electronic devices. These devices interact with each other by field interactions or by direct electrical interconnections. Openings or windows are created for electrical connections through the layers by an assortment of processing techniques including masking, layering, and etching additional materials on top of the wafers. These electrical interconnections may be within the semiconductor or may lie above the semiconductor areas and layers using a complex mesh of conductive layers, usually of metal such as aluminum, tungsten, or copper fabricated by deposition on the surface and then selectively removed. Any of these semiconductor or connectivity layers may be separated by insulative layers, e.g., silicon dioxide.

Integrated circuits and chips have become increasingly complex, with the speed and capacity of chips doubling about every eighteen months because of the continuous advances in design software, fabrication technology, semiconductor materials, and chip design. An increased density of transistors per square centimeter and faster clock speeds, however, make it increasingly difficult to design and manufacture a chip that performs as actually desired. Unanticipated and sometimes subtle interactions between the transistors and other electronic structures may adversely affect the performance of the circuit. These difficulties increase the expense and risk of designing and fabricating chips, especially those that are custom designed for a specific application. The demand for complex custom-designed chips has increased along with the demand for microprocessor-driven applications and products, yet the time and money required to design chips have become a bottleneck to bring these products to market. Without an assured successful outcome within a specified time, the risks have risen with the costs, and the result is that fewer organizations are willing to attempt the design and manufacture of custom chips.

More powerful specialized software tools intended to design chips correctly and efficiently have been introduced to meet the challenge. As the software tools evolve, however, the tools themselves have become increasingly complex requiring more time to master and use them. Correspondingly, the cost of staffing, training, and coordinating the various aspects of chip design has also increased. One general response to this dilemma has been a call for what are termed "higher levels of abstraction," which simply means that the logical entities with which designers work are standardized and encapsulated into "black boxes" or modules. The software tools used to design chips, nevertheless, are so complex that it is difficult to adapt them to this higher level of abstraction. Coordinating these realms of complexity is a challenge in the design and fabrication of a custom chip. Customer needs and specifications must be aligned with tools and capabilities of both designers and fabrication facilities having their own design rules, equipment, molds, recipes and standards that have myriad implications for the final work and, for best practices, must be considered early in the process.

Meanwhile, several types of chips have been developed that take advantage of this modular approach; they are partly fixed and partly programmable/customizable. The utility of these chips is determined by factors such as complexity, cost, time, and design constraints. Field programmable gate array (FPGA) refers to a type of logic chip that can be easily reprogrammed in the field and the modifications are trivial. FPGAs, however, are very large and expensive. Another disadvantage of FPGAs is their relatively high cost per function, relatively low speed, and high power consumption. FPGAs are used primarily for prototyping integrated circuit designs and once a design is set, faster hard-wired chips are produced. Programmable gate arrays (PGAs) are also flexible in the numerous possible applications that can be achieved but not quite as flexible as the FPGAs, and are more time-consuming to modify and test. An application specific integrated circuit (ASIC) is another type of chip designed for a particular application. ASICs efficiently use power compared to FPGAs and are quite inexpensive to manufacture at high volumes. ASICs, however, are very complex to design and prototype because of their speed and quality. Application specific standard products (ASSPs) are hard-wired chips that meet a specific need but this customization is both time-consuming and costly. An example of an ASSP might be a microprocessor in a heart pacemaker.

A difficult optimization and construction problem is that of constructing these and other various registers and internal memory arrays required for any of many distinct designs. Integrated circuits have either an embedded or external central processing unit (CPU) connected to various registers and memory, either or both of which may be located on or off-chip. On-chip, these registers and memories may be logically and/or physically arranged in various modules throughout the integrated circuit. The registers/memory may be read and written by the CPU through memory-mapped accesses connecting the registers/memory and the CPU using at least one internal bus. Today, chip designers and testers manually and separately define the specification and address map for registers and internal memory, as well as separately and manually specify the register transfer logic (RTL) implementation, the verification testcases, and the firmware header file. This approach is time consuming, tedious, and prone to errors created by manual editing. Maintaining consistency with all the minute changes is very difficult.

Because the invention herein facilitates the use of registers of an integrated chip, it may be useful to present a brief discussion of how registers are used in semiconductor products. Registers are a collection of memory elements having a defined and repeatable purpose; if addressable, each element of the register can be individually accessed by an address. Registers may be configured as "read-only" in that the register stores a value indicating, e.g., a state or status. A register may also be a "read-write" register meaning that the value stored in the register element may be observed and modified. A register may also be a "write-only" register meaning that the address associated with the register element monitors an internal change but the values cannot be observed. Writing to a register, moreover, may store or set bits to a particular value in the register; or writing may clear bits or values within the register. Setting or clearing bits within a register, moreover, may further trigger a counter that may affect an operation elsewhere on the integrated circuit when a threshold value in the counter is reached.

In addition to the above capabilities, it is often convenient to specialize a register to be a control register connected to deeper internal logic of the configurable integrated circuits. An example of a control register is the counter. As internal events occur, the counter changes values. When a read and/or a write operation occur, the value of the counter may be returned and optionally, may be reset. A single counter register can be configured to respond to multiple addresses possibly with a different effect for each address. Another specialized register is the status register whose bits are also driven by internal events. A status register is often associated with a mask register. The combination of a status and a mask register may produce a single output bit when both an internal signal and a mask/enable bit are set. This single output bit is often used as an interrupt bit to notify another subsystem of an event. Another entity using a master interface could then read the status register to determine which bit was set. The combination of status and mask registers is often used for edge-sensitive or level-sensitive operation wherein the edge-sensitive operation can be latched until read and/or the level-sensitive operation passes an internal logic value specified by a signal name. Another specialized register is the most significant bit (MSB) register. When a combination of a mask/enable bit and a status bit are arranged in priority order the MSB register can be read to determine the offset of the most significant bit that is set and enabled. This value can be optionally combined with a base offset and multiplier, both of which may be separate registers, to act directly as an interrupt vector in a processor subsystem. Using a MSB register, reading a single bit can provide the address of the interrupt handling routine to process the status bit that was activated and enabled. Such specialized registers are not easily implementable or testable, and as such, are often referred to as performance-enhancing registers.

There is thus a need in the industry to increase the reliability and the flexibility of the design process of addressable registers and internal memories within the integrated circuits yet at the same time reduce the cost of each individual design

SUMMARY OF THE INVENTION

To satisfy the above needs and to realize further advantages, the inventors herein present a method to design an integrated circuit, comprising the steps of inputting an application set having a design database, the design database describing at least one component, and a transistor fabric, and/or at least one addressable hardmac register, and/or at least one addressable hardmac memory, all of the application set; inputting a description of another component, and at least one addressable register and/or addressable memory to be implemented from the transistor fabric and/or the addressable hardmacs register and/or the addressable hardmac memory on the integrated circuit; inputting a configuration of a bus to connect the at least one addressable register and/or the at least one addressable memory with each other and/or at least one component; generating interconnect register transfer logic to connect the at least one addressable register and/or the at least one addressable memory with each other and/or with the at least one component on the bus; and generating an address map of the addressable registers and/or memories. The design database is updated by including the generated interconnect register transfer logic. Additionally, the method may include the step of generating register transfer logic for an additional addressable register and/or an additional addressable memory created from the transistor fabric of the design database. Any unused registers and/or memories in the design database may be identified and register transfer logic may be generated to create performance-enhancing registers from the unused registers and/or memories and to connect these performance-enhancing registers on the bus. As usual, the design database will be updated with any new RTL generated. The step of generating interconnect register transfer logic to connect the at least one addressable register and/or the at least one addressable memory with each other and/or with the at least one component on the bus further comprises generating register transfer logic for a configuration register in a control plane to provide bus interconnect management. The register address generation further enables the generation of header files, static timing analysis files, verification templates, and other related text files formed from the structure of the RTL and register forms.

The invention may further be considered an article of manufacture or transmission of a data storage medium tangibly embodying a program, the program comprising the steps of: reading a plurality of input files relating to a plurality of addressable registers and addressable memories to be designed into a semiconductor product, the input files comprising a functional description of a desired semiconductor product; a configuration for a internal and/or external bus used with the semiconductor product; address parameters for the addressable registers and/or addressable memories; accessing a design database comprising an application set upon which the desired semiconductor product will be designed and a number of tests for any new generated logic to be included for the design of the desired semiconductor product; generating a plurality of output files relating to interconnecting the addressable registers and/or addressable memories with the bus; and updating the design database with the output files. The output files may comprise interconnect register transfer logic, an address map, header files, and a register summary of the addressable registers and/or addressable memories connected on the bus; and may further comprise a plurality of verification testcases and static timing analysis constraints.

The invention may further be considered a register address generation tool, comprising: means to receive a functional description and address parameters of a plurality of addressable registers and/or addressable memories to be created on a desired semiconductor product; means to receive a configuration of an internal and/or external bus to be connected to at least a portion of the plurality of addressable registers and/or the plurality of addressable memories; means to receive input from and provide output to a design database having at least an application set describing a partially manufactured integrated circuit upon which the desired semiconductor product will be built; means to generate interconnect register transfer logic to connect the bus to the portion of addressable registers and/or addressable memories; and means to update the design database with the interconnect register transfer logic. In addition, there may be means to determine that any of the plurality of addressable registers and/or addressable memories will not be used for data flow in the semiconductor product, and means to generate register transfer logic to create performance enhancing registers from the unused addressable registers and/or addressable memories.

BRIEF DESCRIPTION OF THE DRAWINGS

The numerous advantages of the present invention may be better understood by reference to the accompanying figures in which:

FIG. 1 is a simplified block diagram of a networked computer system in which the method and the tool of the invention can be implemented.

FIG. 2 is a simplified block diagram of the functional components within a computer workstation to which an integrated circuit developer may access and use the register address generation tool in accordance with an embodiment of the invention.

FIG. 3 is a simplified block diagram of a semiconductor slice from which the register address generation tool could document, implement, and test registers and internal memory of an integrated circuit in accordance with an embodiment of the invention.

FIG. 4 is a simplified diagram illustrating the hierarchy of register transfer logic (RTL) of a slice description that usable by the register address generation tool in accordance with features of the invention.

FIG. 5 is a simplified block diagram of the inputs to and outputs from the process and tool for register address generation in accordance with an embodiment of the invention. It is suggested that FIG. 5 be printed on the face of the patent.

FIG. 6 is a simplified flow chart of the process by which the register address generation tool generates the RTL, address map, register summary, interconnect RTL, etc. in accordance with an embodiment of the invention.

DESCRIPTION OF THE INVENTION

Referring to the drawings, FIG. 1 illustrates an exemplary computer system 10 upon which a register/memory address generation tool as disclosed herein could be installed and/or used. Computer system 10 is illustrated as a networked computer system that includes one or more client computers 12, 14 and 20 such as workstations coupled through a network 18 to a server 16. Server 16 could also be a personal computer-based server, a minicomputer, a midrange computer, or a mainframe computer. While shown here as a point-to-point connection, computers 12 and 14 need not be coupled to server 16 directly, but may be coupled to yet another network which in turn is connected to server 16. Network 18 may represent practically any type of networked interconnection including but not limited to local-area, wide-area, wireless, and public networks such as the Internet, and any number of routers and hubs connected in between, e.g., a local-area network to a wide-area network to the Internet through a series of routers and/or other servers. Any number of computers and other devices may be networked through network 18, e.g., multiple servers, hand-held devices, etc.

For the purposes of the invention, computer 20 may represent practically any type of computer, computer system, or other programmable electronic device, including a client computer similar to computers 12, 14 and 20 of FIG. 1, a server computer, e.g, similar to server 16 of FIG. 1, a portable computer, an embedded controller, a hand-held device, etc. Computer 20 may be coupled in a network as shown in FIG. 1 or may be a stand-alone device. Computer 20 will hereinafter also be referred to as a computer although it should be appreciated that the term "computer" may also include other suitable programmable electronic devices capable of allowing a chip designer to use the generation tool.

Computer 20 typically receives a number of inputs and outputs for communicating information externally. For interface with a user or operator, computer 20 typically includes one or more user input devices 26, 27, e.g., a keyboard, a mouse, a trackball, a joystick, a touchpad, and/or a microphone, among others, and a display 22 such as a CRT monitor, an LCD display panel, and/or a speaker, among others. Some servers, however, do not support direct user input and output. For additional storage, computer 20 may also include one or more storage devices 36, e.g., a floppy or other removable disk drive, a hard disk drive, a direct access storage device, an optical drive, e.g., a CD drive, a DVD drive, etc., and/or a tape drive, among others, that may be connected directly or may be connected through a SAN or other network. Furthermore, computer 20 may include an interface connected to one or more networks 18, e.g., a local-area network, a wide-area network, a wireless network, and/or the Internet, among others, to permit communication of information with other computers coupled to the network. It should be appreciated that computer 20 typically includes suitable analog or digital interfaces between processor 30 and each of the components 18, 22, 26, 27, and 36 as is known in the art.

Computer 20 operates under the control of an operating system 40 such as a UNIX-based or WINDOWS-based operating system, as is known in the art, but is not so limited by the particular operating system. Operating system 40 executes various computer software applications, components, programs, objects, modules, etc., such as an executable program 42, etc. Although the register address generation tool 50 may be in memory 32 for the purpose of developing an integrated circuit, it need not be. The processor 30 may access the register address generation tool 50, the required data, other various applications components, programs, objects, modules, etc., resident on one or more processors in another computer coupled to computer 20 via a network 18, e.g., in a distributed or client-server computing environment whereby the processing to implement the functions of the register address generation tool may be allocated to multiple computers over a network.

With reference to FIG. 2 wherein the method and apparatus of automating the process of documenting, implementing, and testing addressable registers and internal memories of a chip during chip design as disclosed herein is installed as an application called the register address generation tool on computer 20. Computer 20 typically includes at least one processor 30 coupled to a memory 32. Processor 30 may represent one or more processors or microprocessors and memory 32 may represent the random access memory (RAM) devices comprising the main storage of computer 30, as well as any supplemental levels of memory such as cache memories, nonvolatile or backup memories, programmable or flash memories, read-only memories, etc. In addition, memory 32 may be considered to include memory storage physically located elsewhere in computer 30, e.g., any storage capacity used as a virtual memory, e.g., as stored on a mass storage device 36 coupled to computer 20 with a storage area network (SAN) or on another computer coupled to computer 20 via network 18.

In general, the register address generation tool executed to implement the embodiments of the invention whether implemented as part of an operating system or a specific application, component, program, object, module, or sequence of instructions will be referred to herein as the register address generation tool, GenReg, or just simply, the tool. The tool typically comprises one or more instructions that are resident at various times in various memory and storage devices in a computer, and that, when read and executed by one or more processors in a computer network, cause that computer to perform the steps necessary to execute steps or elements embodying the various aspects of the invention. While the invention has and hereinafter will be described in the context of fully functioning computers and computer systems, those skilled in the art will appreciate that the various embodiments of the invention are capable of being distributed as a program product in a variety of forms and that the invention applies equally regardless of the particular type of signal bearing media used to actually carry out the distribution. Examples of signal bearing media include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links. It should be appreciated that any particular nomenclature that follows is used merely for convenience, and thus the invention should not be limited in its use solely to any specific application identified and/or implied by such nomenclature. The exemplary environments illustrated in FIGS. 1 and 2 are not intended to limit the present invention. Indeed, those skilled in the art will recognize that other alternative hardware and/or software environments may be used without departing from the scope of the invention.

Viewing FIG. 3, a slice 310 is a partially manufactured semiconductor device in which the wafer layers up to the connectivity layers have been fabricated. The slice 310 comprises a base semiconductor wafer from, e.g., silicon, silicon-on-insulator, silicon germanium, gallium arsenide, other Type II, IIII, IV, and V semiconductors, etc. and is a piece of semiconductor material into which hardmacs have been diffused into the semiconductor layers. Diffusing a semiconductor wafer to create a hardmac simply means that during fabrication of the wafer layers, transistors or other electronic devices have been particularly and permanently arranged in the wafer layers to achieve specific functions, such as diffused memory 320–338, 380–390, data transceiver hardware such as I/O PHYs 340–346, clock factories including phase locked loops (PLLs) 350, control I/Os 352, configurable input/output (I/O) hardmacs 354, 356; each of the hardmacs have an optimum arrangement and density of transistors to realize its particular function. The slice further comprises a gate array of transistors, called transistor fabric 360, for further development. Transistor fabric 360 is an array of prediffused transistors in a regular pattern that can be logically configured by a suite of generation tools such as those related patent applications referenced and incorporated by reference, into, inter alia, memories and/or registers. The register address generation tool herein then facilitates the use and optimization of those registers and/or memories. The slice may also comprise at least one, probably several, configurable I/Os 354, 356 built on the transistor fabric 360. The slice 310 may also include a processor 370 that may be connected to other components of the slice on a bus network 375. The slice disclosed herein may have either an embedded processor 370 or an external processor connected through one of the slice's configurable I/Os 354,356. Whether external or internal, the processor may be connected to registers and memory, either or both of which may be located on or off-chip. These registers and memories, moreover, may be logically and physically arranged in modules throughout the integrated circuits. Preferably, some of the registers and/or memories are connected together using at least one internal bus, and are read and written by the CPU and other devices through memory-mapped accesses. The term "bus" within the context of the application herein shall be construed to mean a defined set of signals that provide for masters to initiate read and write operations directed to one or more slave interfaces that respond based on commands and address ranges. Buses further imply tristated signals that are driven by the masters and slaves. To ensure that the correct data and control signals are delivered to the proper on-chip targets, i.e., the slaves, the three state mechanism of multiplexing signals is often implemented by a combination of multiplexers driven by selectors, driven by decoders to provide for deterministic time division sharing of communication resources under the constraints of a defined access protocol. An example of an internal bus may be an AHB, an AHB-LITE, an APB, or other industry standard internal bus, and may be 32 or 64 bits or more wide. Those of skill in the art will appreciate that the internal bus of the slice may not be limited to the above types nor limited to the width nor bus speeds of the above-specified buses.

The slice definition thus is a detailed listing of all the features available on the slice, such as the transistor fabric, a processor specification, the configurable and/or hardmac I/O and memory available, the requirements of the configurable and hardmac I/Os, an internal bus specification, the cost of the slice, the ideal performance that can be expected of the slice, the expected power consumption, and other functional requirements. The slice 310 shown in FIG. 3 is only one example of a slice and its components. Different slices may contain different amounts of transistor fabric, different amounts and types of diffused and/or compiled memories, different types of fixed and configurable I/O blocks, different types and amounts of I/O hardmacs, processors, clocks, etc. depending upon the purpose of the final integrated chip. For instance, if the final chip is intended to be a communication and/or networking integrated circuit, the periphery of the slice may contain many I/O blocks that have been fixed as PHYs and/or that can be configured differently from one another by the register address generation tool herein. The slice 310, moreover, optionally may include the contact mask and some of the fixed higher layers of connectivity for distribution of power, ground, and external signal I/O. A cell refers to the personalization of the interconnect layers that instantiate the logic gates of the transistor fabric 360.

The slice itself is of little use to a designer needing to develop register transfer logic (RTL), so some representation of the diffused resources of the slice is needed; shells are aspects of this representation. Shells are the logic infrastructure that makes the slice useful as a design entity and together the shells and the slice description comprise one embodiment of an application set. The collection of RTL shells include a documentation shell, a verification shell, a synthesis shell, a static timing analysis shell, and a manufacturing test shell, all of which provide input and/or contain output from the register address generation tool. The RTL shell provides a logical description of an aspect of the slice or of the generated or used resources. The documentation shell may be considered the functional description of the resources. The verification shell is the functional verification description, whereas the synthesis shell may be thought of as the generation description. The static timing analysis shell is the timing description, the manufacturing test shell is the test description, and the floorplan shell is a description of the location of the slice resources. Additional shells not necessarily used with the particular register address generation tool described herein may include the floorplan shell and a RTL qualification shell.

These shells may be further grouped hierarchically into modules based upon the source of the RTL and the function of the logic, such as shown in FIG. 4. The generated module 410 preferably comprises RTL logic generated by, e.g., the suite of generation tools referenced and incorporated by reference herein, i.e., GenIO, GenMem, GenClock, etc., but the RTL logic may also be derived from other known semiconductor design tools. The generated module 410 may include some preplaced, timed, and proven components, such as clock generators 412, system controller and reset logic 414, test controllers 416, and/or analog serializers/deserializers (SERDES) hardmac components (not shown). The generated module 410 has connectivity requirements that extend throughout the various modules and it is the register address generation tool described herein that manages the connectivity of the registers and internal memory through bus logic 418 to the several modules along an internal bus 480 and/or external bus 482. Bus logic 418 may include arbiters, multiplexers, decoders, etc. to manage the connectivity and, if necessary, the address translation and register/memory coherence schemes. When a chip designer adds new registers and/or internal memories or deletes existing registers and memories via design changes, the connectivity from the generated module 410 to the outer modules along any addressable bus 480, 482 including a PCI bus 484 is managed through bus logic 418 by the register address generation tool herein and its sister tools referenced in the beginning of this patent.

Surrounding the RTL logic of the generated module 410 is the user module 420. Logic from the customer for whom the integrated circuit is designed comprises the user module 420 and may include registers 422 and 424. Also included in the user module 420 is a list of memories and/or registers having tie-offs, i.e., the memories and/or registers that will not be used for data flow and may thus be allocatable for performance enhancing features offered by the register address generation tool herein, such as control status registers, etc. The register address generation tool generates not only the hierarchy of slave blocks, such as bus slaves 422a and 424a, but also generates that RTL and the interconnect logic so that both the logical interconnection and the physical distribution requirements of the implementation can be supported.

The user module 420 may also include cores 426, an example of which is an AMBA module. Cores, also called IP cores, refer to any prefabricated logic and hardware that have an impact on or are physically affected by or are memories and/or registers. An AMBA module, in accordance with the industry standard AMBA specification, facilitates the implementation of an on-chip bus 480 connecting hardmacs with the corresponding logic so chip developers can implement and test blocks without prior knowledge of the system into which the component will be finally integrated. A typical AMBA-bus consists of a high-speed, high-bandwidth system bus that connects any embedded processors in the slice to high-speed, high-bandwidth I/O peripherals, direct memory access (DMA) controllers to high-bandwidth data-intensive applications using the slice memory and interfaces. The AMBA standard also specifies a peripheral bus connected to the system bus but with a simpler bus protocol designed for ancillary or general-purpose peripherals such as timers, interrupt controllers, UARTs, I/O ports, etc. The incorporation of the AMBA module 426 as a core particularly facilitates the use of the suite of generation tools in a distributed system. Again, the register address generation tool may generate the interconnect logic embodied in the AMBA bus slave 426a.

The fixed module 430 is that portion of the RTL created with the application set and thus encompasses the fixed resources of the application set. The fixed module 430 provides the template upon which the customer's requirements will be built. Recall that the slice and the RTL shells comprise part of the application set, and thus includes, inter alia, a description of the slice, including the cores and several shells provided to the chip designer upon which to build the customer's requirements. The fixed module 430 may be as simple as a logic signals directly to external chip I/Os, or it may be more complex logic upon which the user module 420 and the generated module 410 can build. For example, the fixed module 430 of the RTL shell could include a complete PCI bus controller 432 including all the connections to external I/Os and/or a DDR/SRAM memory controller, a processor subsystem 434, etc. Some of the cores 432–438 within the fixed module 430 are protocol layers matched and bound to the correct I/O hardmacs PHYs in the top module, such as an XGXS 452 to support data transfer at Gigabit Ethernet speeds, or a MW SPI-4 core. The XGXS core 452 is a 10 Gigabit Ethernet transceiver, and the MW SPI-4 core is, for example, an implementation by MODELWARE of a the SPI-4 protocol specified by the Optical Interconnect Form System Packet Interface, version 4. Preferably, it is the register address generation tool described herein that matches and binds the addressable internal memories and register blocks and any cores 432–438 in the fixed module to the top module 450.

The core module 440 encompasses the fixed module 430 and the user module 420 and provides a set of correct and proven logic interfaces connecting the user module 420 and the fixed module with each other and with the top module 450. Although the core module 440 typically will not have any cores, there may be an instance in which a core may be used to connect the fixed module 430 to the user module 420. To the extent that an addressable bus and/or addressable registers/memories are involved, the register address generation tool generates these addresses and manages the interconnect logic in the bus logic 418.

The top module 450 of the RTL shell is the logic for the hardmacs and configured logic towards the periphery of the slice for outside communication. The top module 450 thus contains the I/O blocks and I/O diffused areas and any registers associated with the hardmac and configurable I/Os. The instantiated I/O blocks that use the top module 450 may include the PLLs, the I/O netlists of which a NAND tree is a part, test logic, and lock detect circuits, etc. A number of input tables describing the interconnect templates are used by the register address generation tool to integrate the bus masters of 452a 454a, 456a, 458a, 462a of their respective top module components 452, 454, 456, 458, 462 with the application set and the rest of the design. These top module components may include a JTAG TAP controller 456 that embodies a set of resources related to the possible register and memory configurations for that slice, an Ethernet interface 452, a CPU connection interface 454, and/or an EEPROM interface 458, etc.

FIG. 5 is a simplified diagram of the inputs to and the outputs from the register address generation tool, and as such, provides a general overview of the process. In an embodiment of the invention, a process and a register address generation tool 510 automates the process of documenting, implementing, and testing addressable registers and internal memories during the design of integrated circuits. The register address generation tool herein facilitates the addressability of the memory and register resources on the slice by determining how much address space is needed and then configuring that address space in each addressable memory and register. Preferably, the addressable registers/memory may be connected together using at least one internal bus, read and written by the CPU through memory-mapped accesses as discussed. At 1, the inputs to the register address generation tool include a functional description 512 that comes from the customer and from the application set. The functional description 512 is a not only a description of the physical resources on the slice and the desired integrated circuit, but also a description of how the resources may be used, e.g., how the circuits will be programmed, debug information, an address map, and register descriptions having correct structure and flags. The register address generation tool 510 parses this functional slice description 512. Another input to the register address generation tool 510 is the user setup and options file 514 that specifies, inter alia, the register address generation tool source directory and the type and level of source control used. Also input to the register address generation tool 510 may be the interconnect bus configuration 516 such as bus width, bus speed, and other parameters of the bus. Input further includes either the full list or a subset of the desired output 518. Other source inputs to the register address generation tool 510 include files of address parameters 520 which specify memory regions in the integrated circuit, such as whether to define them by a constant, a specific address alignment, an offset relative to base or previous memory region, or any combination of these. In the register or memory definition, each register or memory is assigned to a memory region. The register address generation tool 510 imports the address parameters 520 in a nested hierarchical manner, e.g., a core responding to more than one address can be imported with a base address.

At 2, the RTL design database 530 is input into the register address generation tool. The RTL design database 530 is much more than just a description of the application set used as a template upon which the customer's integrated circuit will be designed, but includes it. The design database 530 includes the proven and tested RTL of the application set, but also fabricated components, such as generated memory, generated or configurable I/Os modules, clock circuits, etc. The design database 530, moreover, is maintained and updated whenever another component has been added, along with the testcases for the component and its other contents after the new RTL has been tested and passed RTL analysis testing, verification, manufacturing testing, static timing analysis. The design database 530 also contains the floor planning shell, the synthesis shell, and documentation. The register address generation tool is but one tool that continually updates the design database 530 as it generates new output corresponding to generated registers, and interconnect logic, testcases, files, etc. as described herein.

The register address generation tool 510 generates several outputs at 3 that include, but are not limited to, an address map 540 that is a table of the addressable memory and register components and their addresses. Preferably, all addresses within a particular register and/or memory have the same bus interconnect address in the address map 540. The address map 540 may provide an individual address using offsets for the multiple physical or logic register addresses using a core's base address. The base address may be specified as a particular value or as a contiguous address rounded up to a specified power of two. A first core with a 3 32 bit register and a second core having a 2 32 bit register could be specified as being contiguous with the second core rounding up to $2^4$ or 16. In this case, the registers for the first core would have the addresses 0x0000, 0x0004, 0x0008; and the registers for the second core would have the addresses of 0x0010 and 0x0014. The register address generation tool 510 generates not only a summary 542 of all the addressable registers and memory arrays residing in the integrated circuit, but also the RTL 544 for each individual register. The RTL generated by the register address generation tool is both at the module level for the masters, the mux/demux/decode logic, the slaves, the protocol engines and the register instantiations, as well as the interconnect RTL. Between the salves and the masters. The module hierarchy may be input into the register address generation tool, or alternatively, the register address generation tool can learn the module hierarchy in order to provide the port statements to the RTL to produce the bus interconnection independent of the Verilog or VHDL hierarchy. In other words, the master may be at a deeper level in the hierarchy of instantiated components than the slaves, but the register address generation tool still guarantees the master/initiator relationship with the slave/responder.

Other outputs at 4 of the register address generation tool 510 include interconnect RTL 550 necessary for accessing registers and memories; verification testcases 552 for simulation of generated RTL; file listing discrepancies 556 between the design and documentation if a register or memory is found in the design but not in the specification, also referred to as a coherency check, and synthesis and static timing analysis (STA) constraints file(s) 558. The register address generation tool 510 may also generate header files 554. For example, if a first register is defined in the input files with a name of Buss_Aunt and if Buss_Aunt is instantiated by a slave Nerd_Nephew, the register address generation tool might generate an address of 0x0C24 for Buss_Aunt and a base address for all the registers of Nerd_Nephew of 0x0C00, then the header file also produced by the register address generation tool, for Buss_Aunt would have an entry of #define GR_Buss_Aunt 0x0C24 and the header file for Nerd_Nephew would have entries of #define GR Nerd_Nephew base0x0C00 base and #define GR_Buss_Aunt offset 0x0C24 in the .h header files of C or C++ source.

The register address generation tool 510 also generates and outputs a debugger specification file 560 to expedite testing of register and memory accesses and setup of complex integrated operations during initialization of hardware. The debugger specification file 560 can be read into a specific hardware debugger, such as JTAG or Ethernet SNMP, which may generate a graphical user interface with the map of the addressable registers and internal memories automatically loaded. The register address generation tool 510 not only connects an internal and/or external bus to wherever specified, but also generates new RTL modules 562 in the control plane, i.e., configuration registers that are not part of the data flow, e.g. control and status registers that provide interconnect management and internal monitoring. The new RTL modules 562 can be produced in a deterministic and reliable manner. For example, the register address generation tool may generate a MSB register and then optionally disable an individual bit that would otherwise be returned by reading the MSB register. Thus, masking a particular interrupt bit may reduce the number of processor cycles required to react to events on the integrated circuit. As discussed, often these performance-enhancing registers are not implement because of the complexity of the implementation and especially, of the testing. With the "correct-by-construction" techniques used herein and the automated test/verification processes generated by the register address generation tool, what was once unrealizable is now within the realm of realization.

FIG. 6 is a simplified flow chart by which the process of the register address generation tool evaluates the requirements for and generates, inter alia, the interconnection RTL for the addressable registers and internal memories of an integrated circuit. In block 610 and 612, the register address generation tool reads the setup and options file provided by the chip developer, and further reads the address parameters file. Optionally, if specified by source control, the register address generation tool scans the specification of the desired integrated circuit provided by the customer, as in block 614. If the integrated circuit specification is scanned in block 614, preferably in a format compatible with the other generation tools referenced herein, then in block 616, the register address generation tool identifies the registers and internal memories in that specification.

From blocks 612 and 616, the register address generation tool generates the interconnect RTL, the address map, and the register summary as set forth in block 620. The register address generation tool also generates a map of the integrated circuit hierarchy, as in step 622, which is used on the second pass through the register address generation tool to help generate the interconnect RTL.

At step 624, the chip developer uses her/his tools, e.g., GenMem, GenI/O, or other chip design tools, etc., to insert each register into the correct module in the RTL design database. The register address generation tool is invoked a second pass at block 626, this time using not only the integrated circuit specification, such as input in step 614, but also the updated RTL design database as input to the second pass of GenReg at block 626. The register address generation tool optionally uses source control at step 626 to ensure user of the correct and updated release. At step 630, the tool generates the interconnect RTL to access the registers and memories and generates verification testcases, header files, synthesis and STA constraints files. In addition, in block 632, to ensure correct levels of documentation and design, coherency checking between the documentation and the design database is accomplished. Thus, if a register or memory has been added to the RTL but does not exist in the design documentation, the inconsistency is flagged to the design engineer by the register address generation tool and the engineer then is given the capability to update either the RTL and/or documentation. If desired and specified in the options file, any new registers found in the RTL design database will be added to the specification, as in step 632. The new RTL modules generated by the register address generation tool with interconnect logic integrated into the hierarchy are now added to the RTL design database by the chip developer, as in step 634.

Thus, using the register address generation tool, technical writers, chip designers, and firmware engineers spend less time spent on tedious tasks such as documentation updates, individual register RTL coding, and firmware header file development; there are fewer errors in documentation and design; and simulation coverage is ensured by the automatic verification testcase generation. The designs generated by the register address generation tool are scalable with registers inserted and connected into a hierarchical design. The coherency check automatically updates either specification or RTL if there is a mismatch between design and specification.

While various embodiments of the present invention have been described above, it should be understood that they have been presented by way of example and not limitation and that variations are possible. Thus, the breadth and scope of the present invention should not be limited by any of the above-described exemplary embodiments, but should be defined only in accordance with the following claims and their equivalents.

What is claimed is:

1. A method to design an integrated circuit, comprising:
   (a) inputting an application set having a design database, the design database describing a transistor fabric, and/or at least one addressable hardmac register, and/or at least one addressable hardmac memory;
   (b) inputting a description of at least one addressable register and/or at least one addressable memory, implementable from the transistor fabric and/or from the addressable hardmacs register and/or from the addressable hardmac memory on the integrated circuit;
   (c) inputting a configuration of a bus to connect the at least one addressable register and/or the at least one addressable memory with each other and/or with at least one component that is implementable from the design database;
   (d) generating interconnect register transfer logic to connect the at least one addressable register and/or the at least one addressable memory with each other and/or with the at least one component on the bus; and
   (e) generating an address map of the at least one addressable register and/or the at least one addressable memory.

2. The method of claim 1, further comprising:
(a) updating the design database by including the generated interconnect register transfer logic.

3. The method of claim 2, further comprising:
(a) identifying an unused register and/or unused memory in the design database;
(b) generating register transfer logic to create an additional register from the unused register and/or an additional from the unused memory;
(c) generating the interconnect register transfer logic to connect the additional register and/or additional memory on the bus;
(d) adding the generated register transfer logic and the generated interconnect logic to the design database.

4. The method of claim 1, further comprising:
(a) generating register transfer logic for an additional addressable register and/or an additional addressable memory created from the transistor fabric of the design database;
(b) updating the design database by including the generated register transfer logic for the additional addressable register and/or the additional addressable memory.

5. The method of claim 4, wherein the additional addressable register is a control register.

6. The method of claim 4, wherein the additional addressable register is a status register.

7. The method of claim 4, wherein the additional addressable register is a most significant bit register.

8. The method of claim 1, wherein the step of generating interconnect register transfer logic to connect the at least one addressable register and/or the at least one addressable memory with each other and/or with the at least one component on the bus further comprises:
(a) generating register transfer logic for a configuration register in a control plane to provide bus interconnect management; and
(b) updating the design database with the generated register transfer logic for the configuration register.

9. The method of claim 1, further comprising:
(a) generating verification testcases for the generated register transfer logic.

10. The method of claim 1, further comprising:
(a) generating header files for each of the addressable registers and addressable memories.

11. The method of claim 1, further comprising:
(a) generating synthesis static timing analysis constraint files for each of the addressable registers and addressable memories.

12. An article of manufacture, comprising a data storage medium tangibly embodying a program of machine readable instructions executable by an electronic processing apparatus to perform method steps for operating an electronic processing apparatus, said method steps comprising the steps of:
(a) reading a plurality of input files relating to a plurality of addressable registers and addressable memories to be designed into a semiconductor product, the input files comprising a functional description of a desired semiconductor product; a configuration for an internal and/or external bus used with the semiconductor product; address parameters for the addressable registers and/or addressable memories;
(b) accessing a design database comprising an application set upon which the desired semiconductor product will be designed, and accessing a number of tests for any new generated logic to be included for the design of the desired semiconductor product;
(c) generating a plurality of output files relating to interconnecting the addressable registers and/or addressable memories with the bus; and
(d) updating the design database with the output files.

13. The article of manufacture of claim 12, wherein the output files comprise interconnect register transfer logic.

14. The article of manufacture of claim 12, wherein the output files comprise an address map.

15. The article of manufacture of claim 12, wherein the output files comprise header files.

16. The article of manufacture of claim 12, wherein the output files comprise a register summary of the addressable registers and/or addressable memories connected on the bus.

17. The article of manufacture of claim 12, wherein the output files comprise a plurality of verification testcases and static timing analysis constraints.

18. A register address generation tool, comprising:
(a) means to receive a functional description and address parameters of a plurality of addressable registers and/or addressable memories to be created on a desired semiconductor product;
(b) means to receive a configuration of an internal and/or external bus to be connected to at least a portion of the plurality of addressable registers and/or the plurality of addressable memories;
(c) means to receive input from and provide output to a design database having at least an application set describing a partially manufactured integrated circuit upon which the desired semiconductor product will be built;
(d) means to generate interconnect register transfer logic to connect the bus to the portion of addressable registers and/or addressable memories; and
(e) means to update the design database with the interconnect register transfer logic.

19. The register address generation tool of claim 18, further comprising:
(a) means to determine that any of the plurality of addressable registers and/or addressable memories will not be used for data flow in the semiconductor product;
(b) means to generate register transfer logic to create additional registers from the unused addressable registers and/or addressable memories; and
(c) means to update the design database with the generated register transfer logic.

20. The register address generation tool as in claim 18, further comprising means to generate a debug specification file.

* * * * *